United States Patent [19]

Kubo

[11] Patent Number: 5,305,188

[45] Date of Patent: Apr. 19, 1994

[54] ELECTRIC PART HOLDING DEVICE

[75] Inventor: Masaaki Kubo, Tokyo, Japan

[73] Assignee: Yamaichi Electronics Co., Ltd., Tokyo, Japan

[21] Appl. No.: 963,706

[22] Filed: Oct. 20, 1992

[30] Foreign Application Priority Data

Oct. 23, 1991 [JP] Japan .................................. 3-303996

[51] Int. Cl.⁵ ........................................... H01R 23/68
[52] U.S. Cl. .................................... 361/787; 361/747;
361/752; 361/785; 361/807; 174/255; 439/70
[58] Field of Search ............... 361/728, 747, 752, 785,
361/787, 796, 807; 174/52.4, 255; 439/252, 70,
72, 328; 248/220.2, 221.3

[56] References Cited

U.S. PATENT DOCUMENTS 4,725,918 2/1988 Bakker ................................. 361/220
5,000,697 3/1991 Murphy ............................... 439/331

FOREIGN PATENT DOCUMENTS 58-46545 10/1983 Japan .

Primary Examiner—Leo P. Picard
Assistant Examiner—Young Whang
Attorney, Agent, or Firm—Wenderoth, Lind & Ponack

[57] ABSTRACT

An electric part holding device for holding an electric part or part carrier has a base having a polygonal electric part or carrier accommodation portion for receiving an electric part or carrier therein, and a plurality of semi-elliptic springs, one mounted on the base at each opposing corner portion of the accommodation portion or along opposite sides thereof, each spring being resiliently movable between an outwardly convexly curved shape and an inwardly convexly curved shape, each spring in the outwardly convexly curved shape lying across an upper surface of the base for leaving the accommodation portion open for insertion and removal of an electric part or carrier, and in the inwardly convexly curved shape extending across the accommodation portion for being engaged with a corner of an electric part or carrier positioned in the accommodation portion. The plane of curvature of the springs can be angled so that the spring in the convexly inwardly extending shape extends into the accommodation portion to hold an electric part or carrier therein.

6 Claims, 4 Drawing Sheets

12. # ELECTRIC PART HOLDING DEVICE

BACKGROUND OF THE INVENTION

1. Field of the Invention

This invention relates to an electric part holding device in which an electric part such as an IC or a carrier for carrying thereon an electric part is held by semi-elliptic springs mounted on a base, the curvatures of which are reversible between an inwardly convex and an inwardly concave curvature.

2. Brief Description of the Prior Art

In Japanese Utility Model Publication No. Sho. 58-46545, the electric part is accommodated within the electric part accommodation portion formed in the base, and the electric part is held within the accommodation portion by the semi-elliptic springs which can be moved inwardly and outwardly between inwardly concave and inwardly convex curvature, the springs being disposed along two opposite sides (on a defining wall forming the two sides) of the electric part accommodation portion, the springs being engaged with the two sides of the electric part for holding the electric part when the springs are inwardly convex.

Each of the semi-elliptic springs is provided at both ends thereof with shaft holes, and the shaft holes are engaged with threaded shafts, etc. projecting from both ends of each side of the accommodation portion in order to form the semi-elliptic shape for storing spring force.

However, the above conventional device has the following problems. Since the semi-elliptic springs are disposed along the two opposite sides of the accommodation portion and engaged with the two opposite sides of the electric part when the springs are in the inwardly convex positions, when this technique is applied to an IC carrier and the IC carrier is placed on the socket, the semi-elliptic springs disposed along the two sides of the IC carrier (base) interfere with the IC leads and the contacts of the socket when the semi-elliptic springs are brought to the inwardly convex curvature, and as a result, the springs and the carrier can not be contacted with each other.

In the case where the semi-elliptic springs disposed along the two opposite sides of the base are engaged with the two sides of the electric part as in the prior art, springs of a long stroke are required so that they can engage with the electric part along generally the entire length of the two sides, in order to hold the electric part surely and stably. In addition, the springs occupy a large space above the electric part, and this is a bar to installing a cooling device, etc.

Furthermore, when the semi-elliptic springs are inwardly convex from the two sides of the base, the amount of engagement (engaging depth) with respect to the electric part is naturally limited (the engaging depth is shallow). If the amount of movement upon reversal of curvature, i.e., the curvature of each semi-elliptic spring, is set to be large in order to obtain a sufficient amount of engagement with the electric part, the curved portion is caused to extend out of the base when the spring is outwardly convexly curved. As a result, the device becomes large in size and the springs are likely to be deformed.

In the prior art, since the curvatures of the springs are reversed in parallel with the upper surface of the electric part and engaged with the upper surface, it is difficult to obtain an intimate contact between the springs and the upper surface of the electric part. At least, it is impossible to apply a pressing force thereon by the springs. In addition, play occurs between the springs and the electric part due to manufacturing and assembling variations, etc. As a result, a harmful loosening of the electric part in the holding device may occur.

Moreover, in the prior art, since the both ends of the springs are mounted on the base on the shafts, much time and labor is required for assembling. In addition, it takes such additional labor because the shaft inserting portions are wound at both ends of the springs and female screw holes are formed in order to mount the shafts therein. Therefore, the number of parts are increased.

SUMMARY OF THE PRESENT INVENTION

It is therefore a general object of the present invention to provide an electric part holding device which can eliminate all of the above described problems inherent in the prior art.

In order to achieve the above object, there is essentially provided an electric part holding device for holding an electric part by means of engagement of semi-elliptic springs disposed on a base portion external to an electric part accommodation portion formed in a base with an electric part accommodated within said electric part accommodation portion, wherein said semi-elliptic springs are disposed at opposing angular portions of said base which are external to said accommodation portion, said semi-elliptic springs being able to have the curvature reversed from an outwardly convex position where said springs are curved into the area external to said accommodation portion to an inwardly convex position crossing opposing corner portions of said accommodation portion at an angle, said springs, when in said inwardly convex position, being engaged with the electric part in such a manner as to cross at angles opposite angular portions of said electric part.

According to another aspect of the invention, there is also provided an electric part holding device for holding an electric part by means of engagement of semi-elliptic springs disposed at two opposite sides or opposite corner portions of a base portion external to an electric part accommodation portion formed in a base with an electric part accommodated in said electric part accommodation portion, wherein said semi-elliptic springs are inwardly convexly curved with the plane of curvature at an angle with respect to a mating engagement surface of said electric part from an outwardly convex position, where said springs are curved into the area external to said accommodation portion, in order to hold said electric part.

The semi-elliptic springs in the present invention, when in the inwardly convexly curved position, can be engaged with a large portion the electric part in such a manner as to cross at angles the opposing angular portions of the electric part, and the electric part can stably and surely be held by the springs of a short stroke.

According to the present invention, since the semi-elliptic springs are engaged with the electric part at the corner portions thereof where the leads, etc., are not formed and otherwise are as dead spaces, the opposite sides of the electric part where the leads are arranged are free so that the leads can contact with the contacts on the socket board without any trouble.

Moreover, since the plane of curvature of the semi-elliptic springs in the present invention extend at an angle with respect to the mating engagement surface of the electric part in order to hold the electric part, the springs are positively urged against the electric part in order to hold the electric part surely. In other words, owing to the construction in which the springs are inwardly convexly curved and have the plane of curvature at a slant angle, play of the springs with respect to the mating engagement surface of the electric part can be absorbed, and the springs can surely be engaged with the mating engagement surface of the electric part, thereby achieving the initially intended holding function.

Furthermore, the semi-elliptic springs 7 can be easily inserted into and removed from slits in the base and easily assembled with the base. Moreover, owing to the provision of guards, escaping of the spring with the curvature in the outwardly or inwardly convex direction can be prevented effectively.

DETAILED DESCRIPTION OF THE EMBODIMENT

The present invention will now be described with reference to FIGS. 1 through 6.

Figure 1:
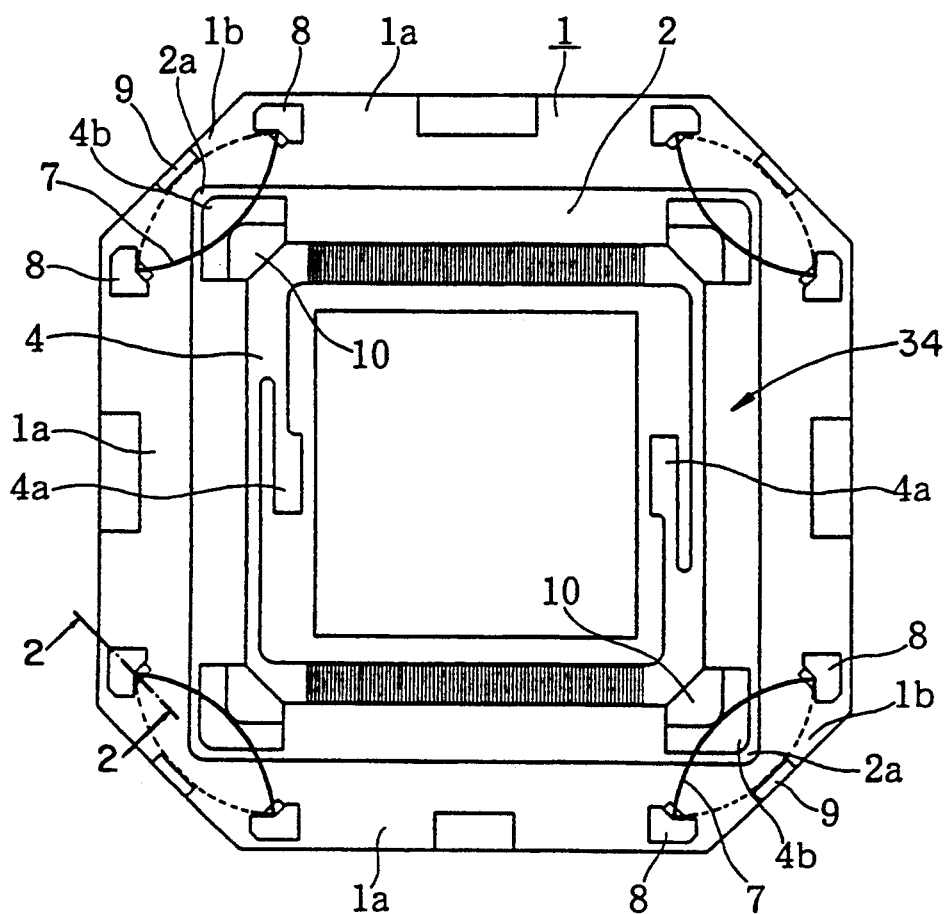
FIG. 1 is a plan view of an electric part holding device embodying the present invention, with an electric part carrier held thereby.
Figure 4:
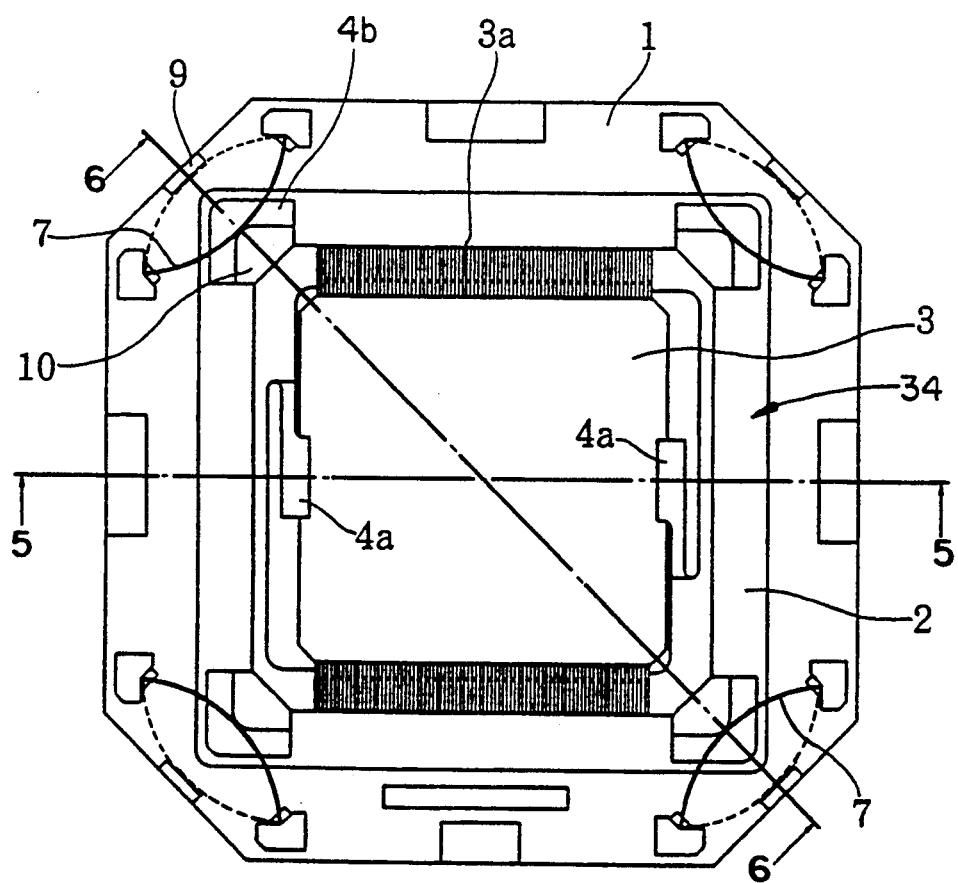
FIG. 4 is a plan view of the above electric part holding device, with an electric part held in the carrier.
Figure 5:
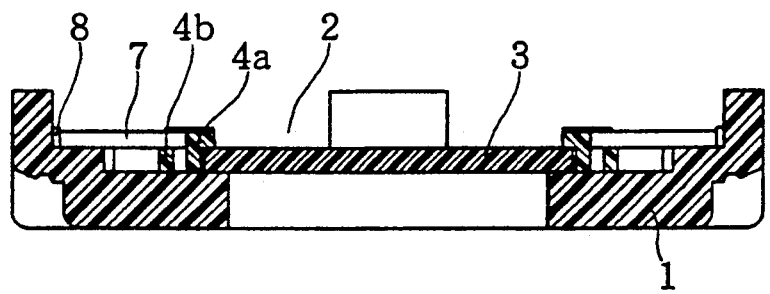
FIG. 5 is a sectional view taken on line 5—5 of FIG. 4.
Figure 6:
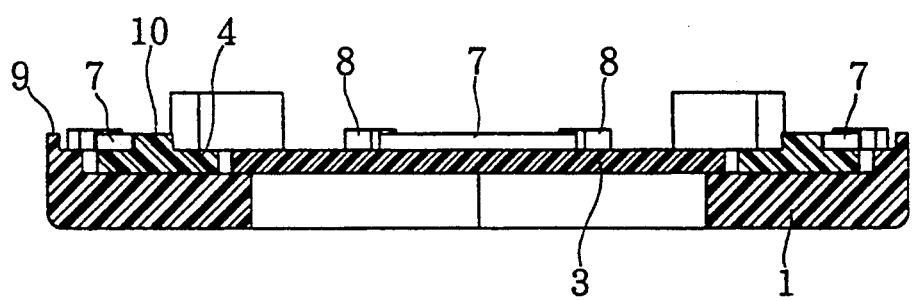
FIG. 6 is a sectional view taken on line 6—6 of FIG. 4.

In FIG. 1, the numeral 1 denotes a base which has a generally rectangular electric part accommodation portion 2 defined in a central portion of an upper surface thereof. As shown in FIG. 4, an electric part 3 is accommodated within the accommodation portion 2. The electric part 3 can be accommodated within the electric part accommodation portion 2 in two ways; one is that the electric part 3 is carried on a carrier 4 constituted by a thin framework and accommodated within the electric part accommodation portion 2 and the other, though not shown, is that the electric part 3 is directly accommodated within the electric part accommodation portion 2 without being carried on a carrier 4.

The term "electric part means" used hereinafter and in the claims of the present invention includes both cases, i.e., the electric part is directly accommodated within the electric part accommodation portion and the electric part is accommodated within the electric part accommodation portion by being carried on the carrier 4, no matter whether this carrier 4 is a one-piece structure or two-piece structure. Reference numeral 34 designates this means. FIG. 1 exemplifies a one-piece type carrier 4. This carrier 4 has means for engaging the electric part with the carrier 4, such as, for example, engaging claws 4a adapted to resiliently engage with and disengage from opposing edge portions of the electric part 3.

The base 1 acts merely as means for holding the electric part 3, (i.e., as a holding device) in this embodiment. However, the base 1 may be constructed such that it constitutes a socket board which contacts leads 3a of the electric part 3, not shown. In this case, the base 1 is provided with contacts, not shown, which are contacted with leads 3a.

Figure 10:
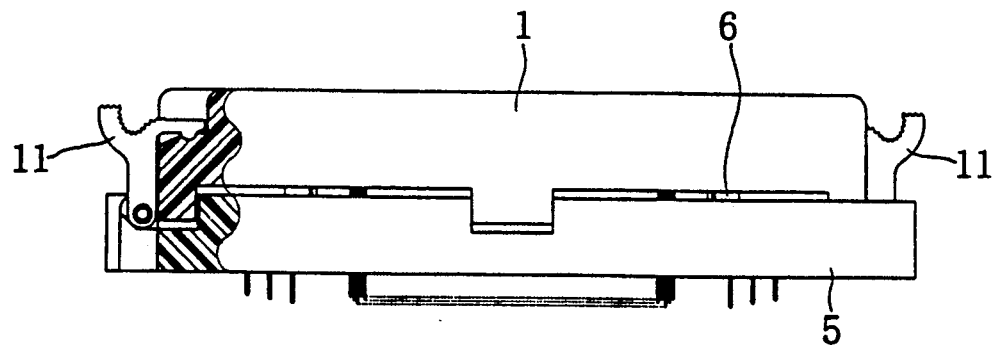
FIG. 10 is a side view, partly cut-away, showing the electric part holding device of the above embodiments placed on a socket board.

In the case where the base 1 is used merely as the electric part holding device, the base 1 for holding the electric part 3, as shown in FIG. 10, can be placed on a mating socket board 5 so that the electric part on the base 1 has the contacts thereof in contact with contacts 6 on the socket board 5. Therefore, the leads 3a of the electric part 3 are exposed on an open surface side of the accommodation portion 2 in the base 1 and are contacted with the contacts 6 on the open surface side. In this arrangement, the base 1 is locked to the socket board 5 by lock means 11, and the leads 3a are urged against the contacts to obtain contact pressure.

As shown in FIGS. 1 through 6 inclusive, the base 1 constituting the holding device or socket is provided with semi-elliptic springs 7 as means for holding the electric part means 34, and the semi-elliptic springs 7 are disposed at opposing angular corner portions of the base 1 which are at a peripheral area of the electric part accommodation portion 2.

In the drawing, a wall 1a for defining the accommodation portion 2 is formed along the peripheral area of the frame 1 and the semi-elliptic springs 7 are disposed on the upper surfaces of the angular corner portions of the defining wall 1a. Each of the semi-elliptic springs 7 is resiliently held between a pair of spring holding portions 8 which are disposed on each side of the angular corner portion of the defining wall 1a. Each semi-elliptic spring 7 is compressed into a semi-elliptic shape between the adjacent spring holding portions 8, so that the spring 7 stores spring energy. The curvature of spring 7 can be reversed between outwardly and inwardly corner curvatures with respect to a reference to a straight line connecting the spring holding portions 8. In other words, the semi-elliptic springs 7 are each movable from an outwardly convexly curved shape as indicated by the phantom lines crossing, at angles, the upper surface of each of angular corner portions 1b (external to the electric part accommodation portion 2) of the defining wall 1a as shown in, for example, FIGS. 1 and 4 to an inwardly convexly curved shape as indicated by the solid lines crossing, at angles, each corner portion 2a of the electric part accommodation portion 2. At the inwardly convexly curved shape, the semi-elliptic springs 7 are strongly engaged with the electric part means 34 in such a manner as to cross at angles with opposing angular corner portions 4b of the electric part means 34 as shown in FIG. 4, in order to stably hold the electric part means 34 on the base 1.

The illustrated example shows a case where the semi-elliptic springs 7 are engaged with the electric part means 34 in such a manner as to cross at angles the angular portion 4b of the carrier 4 for carrying the electric part 3. However, the present invention includes, as mentioned before, the case where a main body of the electric part 3 is directly engaged by the semi-elliptic spring.

Figure 2:
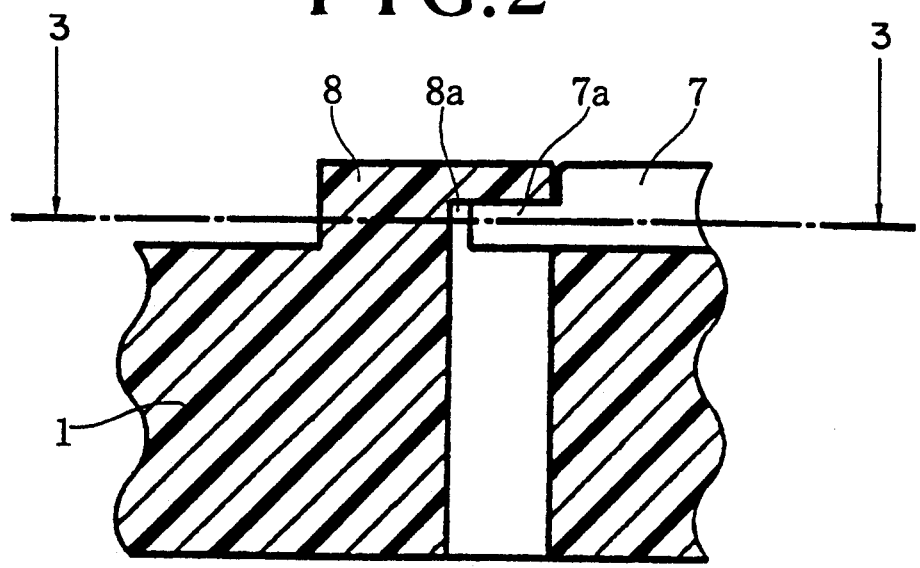
FIG. 2 is a partial sectional view taken on line 2—2 of FIG. 1.
Figure 3:
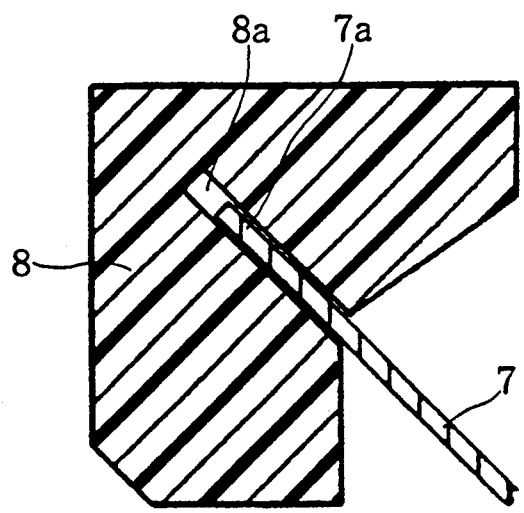
FIG. 3 is a partial sectional view taken on line 3—3 of FIG. 2.

Each spring holding portion 8 is formed of a small block integrally projecting from the upper surface of the angular portion formation wall (defining wall 1a) of the base 1. The adjacent small blocks are provided with slits 8a formed in opposing surfaces thereof as shown in FIGS. 2 and 3. Opposite ends of the semi-elliptic spring 7 are engaged in the respective slits 8a to bias the spring into a semi-elliptic shape in order to store spring energy. The semi-elliptic spring 7 may be formed as, for example, a plate spring. In this case, both ends of the semi-elliptic spring are cut to form narrow engaging elements 7a, respectively, and the engaging elements 7a, as shown in FIG. 3 are engaged in the slits 8a, respectively, which are formed in the small blocks constituting the spring holding portions 8, and step portions of the basal portions of the engaging elements 7a are abutted with the projections 8 at the inlets of the slits respectively, or one ends of the engaging elements 7a are abutted with the inner end surfaces of the slits 8a respectively so that the springs are formed in a semi-elliptic shape in order to store spring energy. Examples of such springs 7 include a plate spring, and a wire rod such as a piano wire.

In FIGS. 1 through 6 inclusive, a spring guard 9 adapted to prevent the spring 7 from escaping and facing a convexly curved surface of the spring 7 when the semi-elliptic spring 7 is in the outwardly curvature is formed in such a manner as to project from an area external to the accommodation portion 2 (in the illustrated example, an upper surface of the angular corner portion of the defining wall 1a).

A spring guard 10 adapted to prevent the spring 7 from escaping and facing the inwardly convexly curved surface of the spring 7 when the semi-elliptic spring 7 is convexly inwardly curved is formed in such a manner as to project from the upper surface of the angular corner portion of the electric part means 34. In the illustrated example, the electric part 3 is carried on the carrier 4 and the guard 10 is formed in such a manner as to project from the angular corner portion of the carrier 4.

The guard 9 on the outwardly convexly curved side and the guard 10 on the inwardly convexly curved side are located opposite to a face of the convexly curved surface of the semi-elliptic spring 7, respectively.

In the outwardly or inwardly curved position, the semi-elliptic spring 7 with spring energy stored therein is press contacted at the face thereof with the spring guard 9 or 10, or they are slightly from the spring guard 9 or 10. The spring guards 9 and 10 are integrally projected from the upper surface of the defining wall of the angular portion and the upper surface of the angular portion of the carrier 4 for carrying the electric part.

Figure 7:
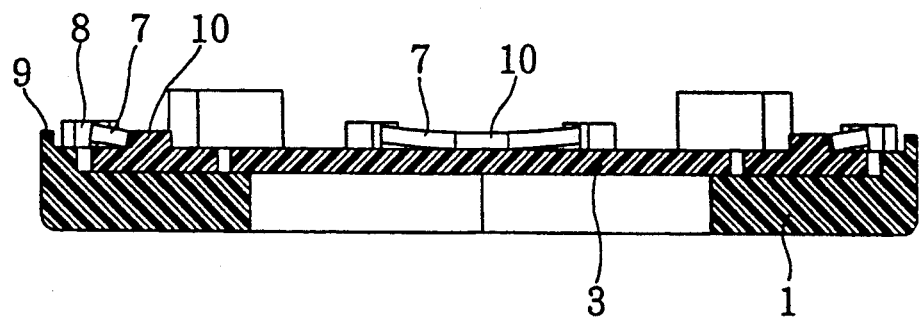
FIG. 7 is a sectional view of another embodiment taken on a line like line 6—6 of FIG. 4.
Figure 8:
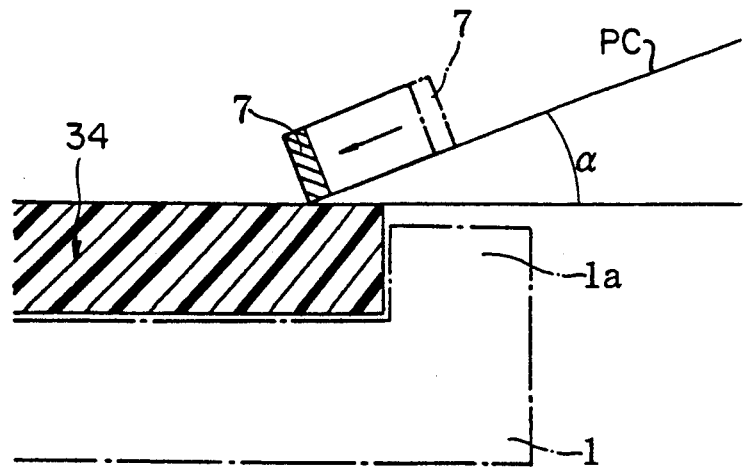
FIG. 8 is a partial sectional view of the embodiment of FIG. 7, schematically showing a state where a semi-elliptic spring is inwardly convexly curved with respect to a mating engagement surface situated at a high level.
Figure 9:
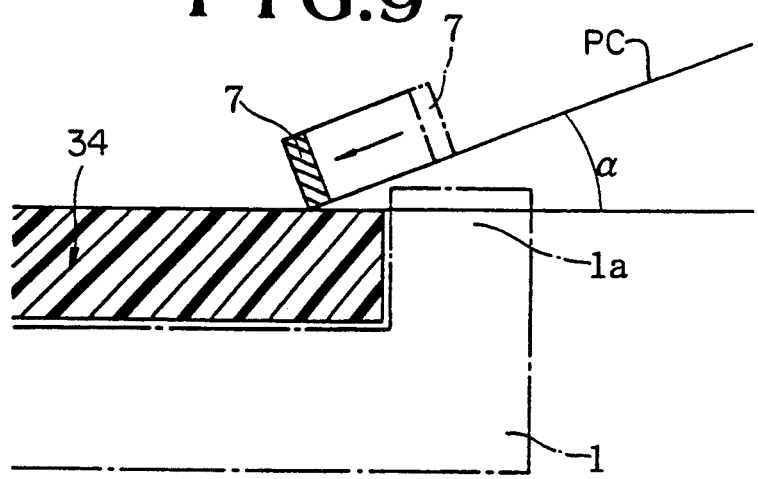
FIG. 9 is a partial sectional view of the embodiment of FIG. 7, schematically showing a state where a semi-elliptic spring is inwardly convexly curved with respect to a mating engagement surface situated at a low level.

Next, FIGS. 7 through 9 inclusive show another embodiment in which the semi-elliptic spring 7 is inwardly convexly curved in a plane of curvature PC at an angle α with respect to the mating engagement surface of the electric part means 34 from an outwardly curved shape where the semi-elliptic spring 7 is outwardly convexly curved to the area external to the accommodation portion 2, in order to hold the electric part means 34.

The springs 7 are disposed at two opposing sides of the base portion in the area external to the electric part accommodation portion 2 of the base 1, or they are disposed, as shown in FIGS. 1 through 6 inclusive, at the opposing base angular corner portions 1b in the area external to the electric part accommodation portion 2. In the foregoing locations, the semi-elliptic springs 7 are convexly curved inwardly at the slant angle α with respect to the mating engagement surface of the angular portions of the electric part 3 or the angular portion of the carrier 4 from the outwardly convex curvature so as to be urged against the mating engagement surface in order to apply a downward force thereto.

In the case where the semi-elliptic springs 7 are disposed in such a manner as to be able to engage with the respective angular portions or sides of the electric part 3 or its carrier 4 at a slant angle of α, even if the level of the mating engagement surface of the electric part 3 with respect to the spring 7, for example, becomes relatively high with respect to the defining walls 1a as shown in FIG. 8, etc., or even if the level of the mating engagement surface of the electric part 3 becomes relatively low with respect to the defining wall 1a, etc. as shown in FIG. 9, the spring 7 can positively press the mating engagement surface of the electric part means 34, compensating for such level difference. The semi-elliptic spring 7 shown in FIGS. 7 through 9 inclusive is formed of an elongated plate spring, and this plate spring, as shown, is inclined inwardly and forwardly at the slant angle of α while maintaining this forwardly inclined posture.

In the case where the socket comprises the base 1 provided with the contacts, the semi-elliptic spring 7 shown in FIGS. 7 through 9 inclusive can function as a pressing means for obtaining a contact pressure by urging the leads 3a of the electric part 3 against the contacts.

The semi-elliptic springs in the present invention, when in the inwardly convexly curved shape, can be strongly engaged with the electric part in such a manner as to cross at angles the opposing angular portions of the electric part means, and the electric part means can be stably and surely held by the springs which are movable though only a short stroke between the inward and outward curvatures.

Furthermore, by outwardly convexly curving the portion above the angular portion of the base, the projection of the springs from the base can be limited as much as possible, and thus, a sufficient amount of curvature can be obtained when the springs are inwardly curved. In addition, the intended engaging depth can be obtained, and a large size base is not required.

Moreover, since the curvature of semi-elliptic springs in the present invention is reversed at a slant angle with respect to the mating engagement surface of the electric part in order to hold the electric part, play of the springs with respect to the mating engagement surface of the electric part can be compensated, and the springs can be positively engaged with the mating engagement surface of the electric part means. Moreover, a downward force can be applied to the mating engagement surface, and the intended object for surely holding the electric part can effectively be achieved.

Furthermore, the semi-elliptic springs 7 can be easily inserted into and removed from the slits and easily assembled with the base. Moreover, owing to the provision of the guards, escaping of the springs in the outwardly or inwardly curved shape can be prevented effectively.

According to the present invention, since the semi-elliptic springs are engaged with the electric part means at the corner portions thereof where the leads, etc. are not formed and otherwise dead spaces, the leads arranged on the opposing sides of the electric part means and the contacts arranged on the socket board can be contacted with each other without any trouble.

What is claimed is:

1. An electric part holding device for holding an electric part comprising:
    a base having a polygonal electric part means accommodation portion for receiving the electric part therein, said accommodation portion having at least two opposing angular corner portions; and
    a plurality of semi-elliptic springs, one mounted on said base at each opposing corner portion of said accommodation portion, each spring being resiliently movable between an outwardly convexly curved shape and an inwardly convexly curved shape, each spring in the outwardly convexly curved shape lying across an upper surface of said base at the corresponding corner portion for leaving said accommodation portion open for insertion and removal of the electric part, and in the inwardly convexly curved shape extending across said accommodation portion at the corresponding corner portions for being engaged with a corner of the electric part positioned in said accommodation portion.

2. The electric part holding device as claimed in claim 1 in which said semi-elliptic springs each have a plane of curvature at an angle to said upper surface of said base for causing said semi-elliptic spring, when it is in the inwardly convexly curved shape, to extend downwardly into said accommodation portion.

3. An electric part holding device for holding an electric part, comprising:
    a base having an electric part means accommodation portion for receiving the electric part therein, said accommodation portion having at least two opposing sides defining said accommodation portion; and
    a plurality of semi-elliptic springs, one mounted on said base on each of said opposing sides, each spring being resiliently movable between an outwardly convexly curved shape and an inwardly convexly curved shape, each spring in the outwardly convexly curved shape lying across an upper surface of said base along the corresponding side for leaving said accommodation portion open for insertion and removal of the electric part, and in the inwardly convexly curved shape extending over said accommodation portion along the corresponding side for being engaged with the electric part positioned in said accommodation portion, said semi-elliptic springs each having a plane of curvature at an angle to said upper surface of said base for causing said semi-elliptic spring when it is in the inwardly convexly curved shape to extend downwardly into said accommodation portion.

4. The electric part holding device as claimed in claim 2 or 3 in which said base has spring holding portions thereon at the positions of the respective ends of said semi-elliptic springs, said spring holding portions having slits therein in which the respective ends of said semi-elliptic springs are removably engaged.

5. The electric part holding device as claimed in claim 2 or 3 in which said base has a plurality of guards thereon, one adjacent each semi-elliptic spring and facing a convexly curved surface of said semi-elliptic spring when said spring is in the outwardly convexly curved shape for preventing escape of said spring from said base.

6. The electric part holding device as claimed in claim 2 or 3 further comprising the electric part positioned in said accommodation portion, and a plurality of further guards on said electric part means, one adjacent each semi-elliptic spring and facing a convexly curved surface of said semi-elliptic spring when said spring is in the inwardly convexly curved shape for preventing escape of said spring from said base.

* * * * *